United States Patent
Lee et al.

(10) Patent No.: US 9,977,735 B2
(45) Date of Patent: May 22, 2018

(54) DATA STORAGE DEVICE AND OPERATING METHOD THEREOF

(71) Applicant: SK hynix Inc., Gyeonggi-do (KR)

(72) Inventors: Keun Woo Lee, Gyeonggi-do (KR); Jong Hee Han, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 268 days.

(21) Appl. No.: 14/715,245

(22) Filed: May 18, 2015

(65) Prior Publication Data

US 2016/0232086 A1    Aug. 11, 2016

(30) Foreign Application Priority Data

Feb. 9, 2015 (KR) .................... 10-2015-0019614

(51) Int. Cl.
| | |
|---|---|
| *G06F 12/02* | (2006.01) |
| *G11C 16/08* | (2006.01) |
| *G11C 16/10* | (2006.01) |
| *G11C 16/26* | (2006.01) |

(52) U.S. Cl.
CPC .......... *G06F 12/0246* (2013.01); *G11C 16/08* (2013.01); *G06F 2212/7201* (2013.01); *G11C 16/10* (2013.01); *G11C 16/26* (2013.01)

(58) Field of Classification Search
CPC ..... G11C 16/0483; G11C 16/10; G11C 16/06; G11C 16/08; G11C 16/3418; G11C 16/3436; G11C 7/106; G11C 7/1087; G11C 16/32; G11C 16/34; G11C 2207/2245; G06F 12/0246; G06F 3/061; G06F 3/0659; G06F 3/0688
See application file for complete search history.

(56) References Cited

U.S. PATENT DOCUMENTS

| | | | | |
|---|---|---|---|---|
| 7,624,238 | B2 * | 11/2009 | Miura ................ | G06F 12/0215 365/185.12 |
| 2008/0294837 | A1 * | 11/2008 | Suda .................... | G06F 3/0613 711/103 |
| 2013/0163335 | A1 * | 6/2013 | Kim ................... | G11C 16/0483 365/185.12 |
| 2013/0275658 | A1 * | 10/2013 | Han .................... | G06F 12/0246 711/103 |

FOREIGN PATENT DOCUMENTS

KR    1020140074371    6/2014

\* cited by examiner

*Primary Examiner* — Zhuo Li
(74) *Attorney, Agent, or Firm* — IP & T Group LLP

(57) ABSTRACT

An operating method of a data storage device includes setting a first page access unit using a first page electrically coupled with a first word line of a first plane and a second page electrically coupled with a second word line of a second plane; and setting a second page access unit using a third page electrically coupled with a second word line of the first plane and a fourth page electrically coupled with a first word line of the second plane.

19 Claims, 11 Drawing Sheets

DATA STORAGE DEVICE AND OPERATING METHOD THEREOF

CROSS-REFERENCES TO RELATED APPLICATION

The present application claims priority under 35 U.S.C. § 119(a) to Korean application number 10-2015-0019614, filed on Feb. 9, 2015, which is incorporated herein by reference in its entirety.

BACKGROUND

1. Technical Field

Various embodiments of the present invention relate to a data storage device and an operating method thereof.

2. Related Art

Recently, the computing environment paradigm has converted to ubiquitous computing so that computer systems can be used anytime and anywhere. Due to this fact, the use of portable electronic devices such as mobile phones, digital cameras, and notebook computers has rapidly increased. In general, such portable electronic devices use a data storage device having a memory device. The data storage device is used as a main memory device or an auxiliary memory device of the portable electronic devices.

A data storage device using a memory device provides advantages of excellent stability and durability, fast information access, and low power consumption. Data storage devices having such advantages include universal serial bus (USB) memory devices, memory cards having various interfaces, universal flash storage (UFS) devices, and solid-state drives (SSD).

As large capacity files such as audio files and video files are used in portable electronic devices, data storage devices need to have large storage capacities. Therefore, the data storage device includes a plurality of memory devices. To efficiently control or access the memory devices, the data storage device may set memory regions of the respective memory devices as access units.

SUMMARY

Various embodiments of the present invention are directed to a data storage device capable of setting access units with improved data reliability and an operating method thereof.

In an embodiment of the present invention, an operating method of a data storage device may include: setting a first page access unit using a first page electrically coupled with a first word line of a first plane and a second page electrically coupled with a second word line of a second plane; and setting a second page access unit using a third page electrically coupled with a second word line of the first plane and a fourth page electrically coupled with a first word line of the second plane.

In an embodiment of the present invention, an operating method of a data storage device may include: setting a first page access unit using a first logic page electrically coupled with a first word line of a first plane and a first logic page electrically coupled with a second word line of a second plane; setting a second page access unit using a second logic page electrically coupled with the first word line of the first plane and a second logic page electrically coupled with the second word line of the second plane; setting a third page access unit using a first logic page electrically coupled with a second word line of the first plane and a first logic page electrically coupled with a first word line of the second plane; and setting a fourth page access unit using a second logic page electrically coupled with the second word line of the first plane and a second logic page electrically coupled with the first word line of the second plane.

In an embodiment of the present invention, a data storage device may include: first and second nonvolatile memory devices each including first and second planes; and a controller suitable for setting an access unit for accessing the first and second nonvolatile memory devices, wherein the controller sets a page access unit using alternating pages electrically coupled with different word lines of the first and second planes of the respective first and second nonvolatile memory devices, in an order of the first and second nonvolatile memory devices and order of the first and second planes.

DETAILED DESCRIPTION

Figure 1:
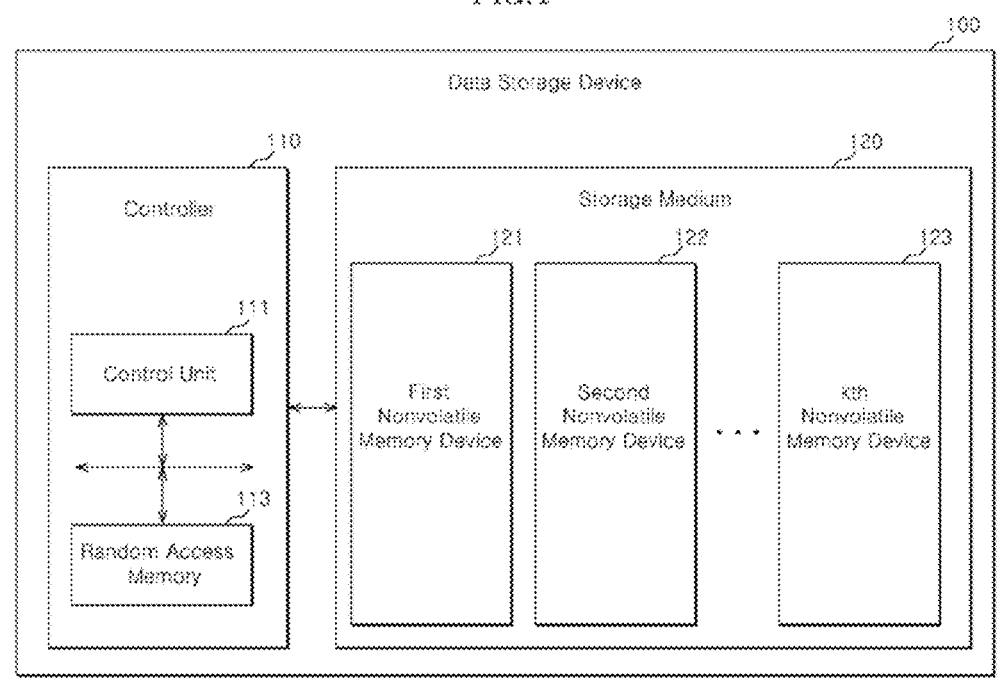
FIG. 1 is a block diagram illustrating a data storage device in accordance with an embodiment of the present invention.

In the present invention, advantages, features and methods for achieving them will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in detail to the extent that a person skilled in the art to which the invention pertains can easily enforce the technical concept of the present invention.

It is to be understood herein that embodiments of the present invention are not limited to the particulars shown in the drawings and that the drawings are not necessarily to scale and in some instances proportions may have been exaggerated to more clearly depict certain features of the invention. While particular terminology is used herein, it is to be appreciated that the terminology used herein is for the purpose of describing particular embodiments only and is not intended to limit the scope of the present invention.

As used herein, the term "and/or" Includes any and all combinations of one or more of the listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements thereof.

Hereinafter, a data storage device and an operating method thereof will be described below with reference to the accompanying drawings through various examples of embodiments.

FIG. 1 is a block diagram illustrating a data storage device 100 in accordance with an embodiment of the present invention. The data storage device 100 may store data to be accessed by a host device (not shown) such as a mobile phone, an MP3 player, a laptop computer, a desktop computer, a game player, a TV, an in-vehicle infotainment system, and so forth. The data storage device 100 may also be referred to as a memory system.

The data storage device 100 may be manufactured as any one of various kinds of storage devices according to the protocol of an interface which is electrically coupled with the host device. For example, the data storage device 100 may be configured as any one of various kinds of storage devices such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, a memory stick, and so forth.

The data storage device 100 may be manufactured as any one of various kinds of package types. For example, the data storage device 100 may be manufactured as a package-on-package (POP), a system-in-package (SIP), a system-on-chip (SOC), a multi-chip package (MCP), a chip-on-board (COB), a wafer-level fabricated package (WFP) and a wafer-level stack package (WSP).

The data storage device 100 may include a controller 110 which controls the general operations of the data storage device 100. The controller 110 may include a control unit 111 and a random access memory 113.

The control unit 111 may analyze and process a signal which is inputted from the host device. To this end, the control unit 111 may decode and drive the firmware or software loaded on the random access memory 113. The control unit 111 may be realized in the form of hardware or by a combination of hardware and software.

The random access memory 113 may store firmware or software to be driven by the control unit 111. Also, the random access memory 113 may store data necessary for the driving of the firmware or the software, for example, metadata such as an address mapping table. That is to say, the random access memory 113 may operate as the working memory of the control unit 111.

The random access memory 113 may temporarily store data to be transmitted from the host device to a storage medium 120 or from the storage medium 120 to the host device. In other words, the random access memory 113 may operate as a data buffer memory or a data cache memory.

The storage medium 120 may include nonvolatile memory devices 121 to 123. Each of the nonvolatile memory devices 121 to 123 may include any one of various types of nonvolatile memory devices such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PRAM) using a chalcogenide alloy, and a resistive random access memory (RE-RAM) using a transition metal oxide, according to the kind or construction of the memory cells. In the following descriptions, the data storage device 100 in which the storage medium 120 is constructed by a plurality of NAND flash memory devices (hereinafter, referred to as flash memory devices) 121 to 123 will be exemplified.

To efficiently control or access the flash memory devices 121 to 123, the controller 110 may set (or configure) the respective memory regions of the flash memory devices 121 to 123, using access units. The access units are units for the controller 110 to access the respective memory regions of the flash memory devices 121 to 123. The access units may include a block unit which is formed of the respective memory blocks of the flash memory devices 121 to 123. Also, the access unit may include a page unit which is formed of the respective pages of the flash memory devices 121 to 123. For instance, the block unit may be referred to as a super block, and the page unit may be referred to as a super page or a stripe. The access units set by the controller 110 will be described below in detail with reference to drawings.

Figure 2:
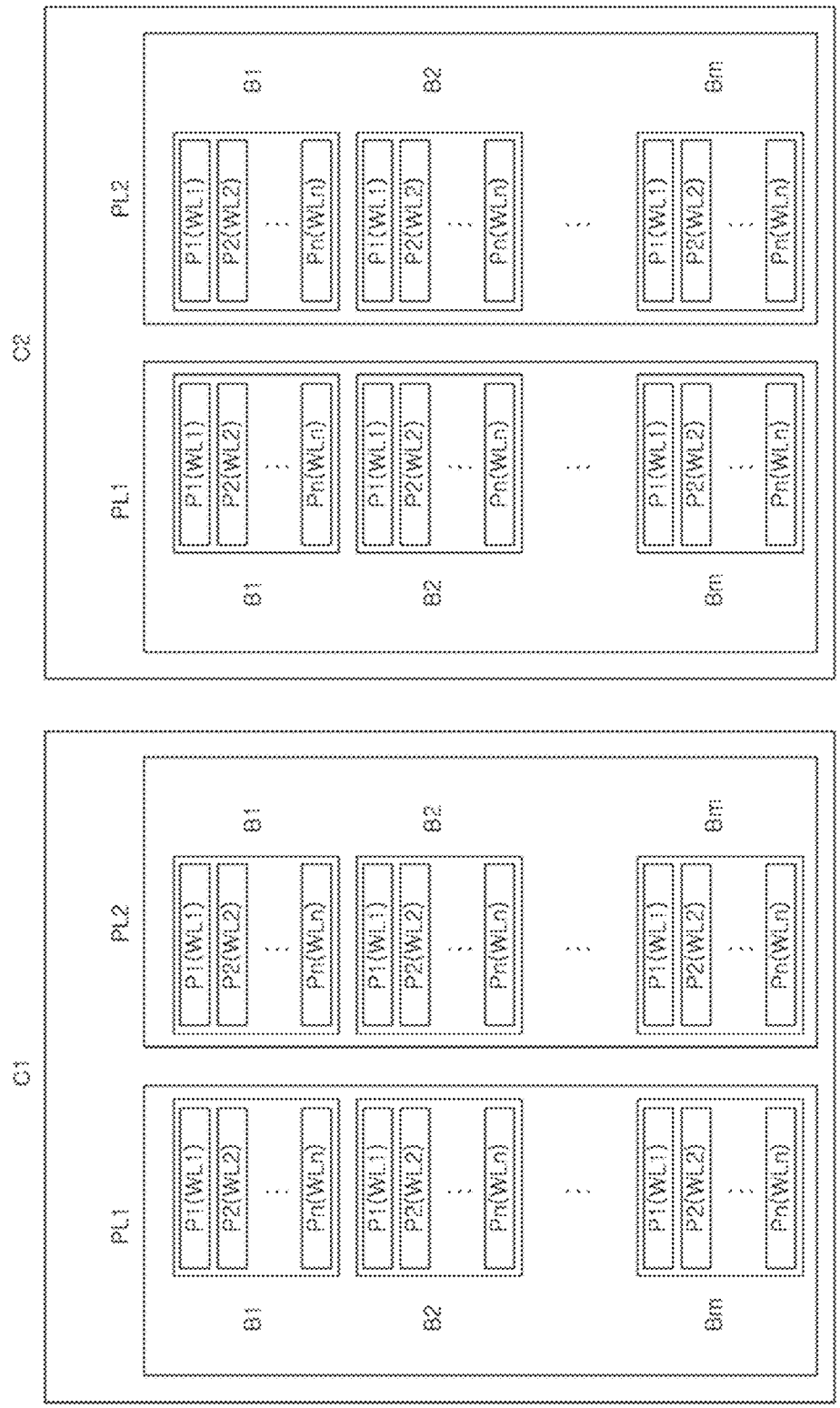
FIG. 2 is a detailed diagram of a storage medium shown in FIG. 1, which includes single level cell type flash memory devices.
Figure 3:
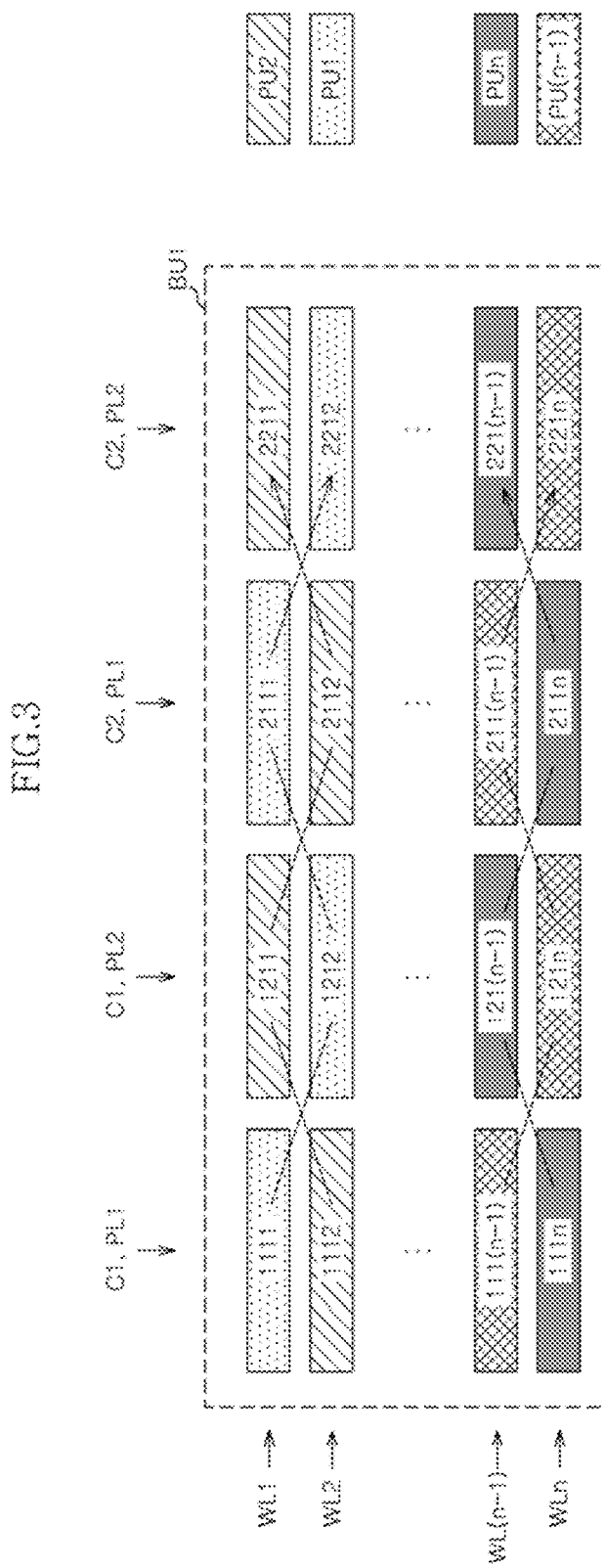
FIG. 3 is a diagram for describing a method for setting access units for the memory region structure shown in FIG. 2.

FIG. 2 is a diagram illustrating the storage medium 120 shown in FIG. 1, which includes single level cell type flash memory devices. FIG. 3 is a diagram for describing a method for setting access units for the memory region structure shown in FIG. 2.

For a clear explanation, an example will be described in which two flash memory devices C1 and C2, each including two planes PL1 and PL2, each of which includes m number of blocks B1 to Bm, each including n number of pages P1 to Pn, forms the storage medium 120 of the data storage device 100. Since the structures of the first flash memory device C1 and the second flash memory device C2 are the same, descriptions for the second flash memory device C2 will be omitted.

Memory cells which configure the memory region of the first flash memory device C1 may include hierarchical cell sets or cell units in an operational viewpoint or in a physical (or structural) viewpoint. For example, memory cells which are electrically coupled with the same word line WL and are simultaneously read and programmed may be configured as a page P, and memory cells which are simultaneously erased may be configured as a block B.

Sets of memory cells (that is, pages Ps), which are controlled by different read/program circuits (not shown), although they are electrically coupled with the same word line WL, may be included in different planes PLs according to their corresponding read/program circuits. Pages Ps which are included in different planes PLs among the pages Ps electrically coupled with the same physical word line WL will be defined as corresponding pages.

Because corresponding pages are electrically coupled with the same word line WL and are controlled by different read/program circuits, they may operate in parallel or individually. For example, the first page P1 of the first block B1 of the first plane PL1 and the first page P1 of the first block B1 of the second plane PL2 corresponding thereto may operate in parallel or individually.

In such a memory region structure, the controller 110 may set access units to efficiently control or access the respective blocks Bs and pages Ps of the flash memory devices C1 and C2.

The controller 110 may set an access unit (hereinafter, referred to as a block unit BU) using blocks of the respective planes PL1 and PL2 of the flash memory devices C1 and C2 which have the same block address. For example, the controller 110 may set a first block unit BU1 using the first block B1 of the first plane PL1 of the first flash memory device C1, the first block B1 of the second plane PL2 of the first flash memory device C1, the first block B1 of the first plane PL1 of the second flash memory device C2 and the first block B1 of the second plane PL2 of the second flash memory device C2.

The controller 110 may set a page access unit PU using pages Ps electrically coupled with different word lines WLs of the respective planes PL1 and PL2 of the flash memory devices C1 and C2. In detail, the controller 110 may set the page unit PU using alternating pages Ps electrically coupled with physically adjacent word lines WLs, for example, word lines WLs having consecutive physical or logical addresses, in the order of the planes PL1 and PL2 and the flash memory devices C1 and C2.

For example, a first page unit PU1 may be set to include a page 1111, a page 1212, a page 2111 and a page 2212. The page 1111 is electrically coupled with a first word line WL1 and included in the first plane PL1. The page 1212 is electrically coupled with a second word line WL2 consecutive to the first word line WL1 in ascending order of word line address and included in the second plane PL2, next to the first plane PL1, where the page 1111 is included. The page 2111 is electrically coupled with the first word line WL1 consecutive to the second word line WL2 in descending order and included in the second flash memory device C2 next to the first flash memory device C1 where the page 1212 is included and in the first plane PL1 next to the second plane PL2 where the page 1212 is included. The page 2212 is electrically coupled with the second word line WL2 consecutive to the first word line WL1 in ascending order of word line address and included in the second plane PL2 next to the first plane PL1 where the page 2111 is included.

In this way, the controller 110 may set page units PU1 to PUn in the first block unit BU1.

As the page unit PU is set using alternating pages in the order of the planes PL1 and PL2 and the flash memory devices C1 and C2, corresponding pages are not included in the same page unit PU. Thus, it is possible to prevent all corresponding pages from failing due to a failure occurring in a shared word line.

Figure 4:
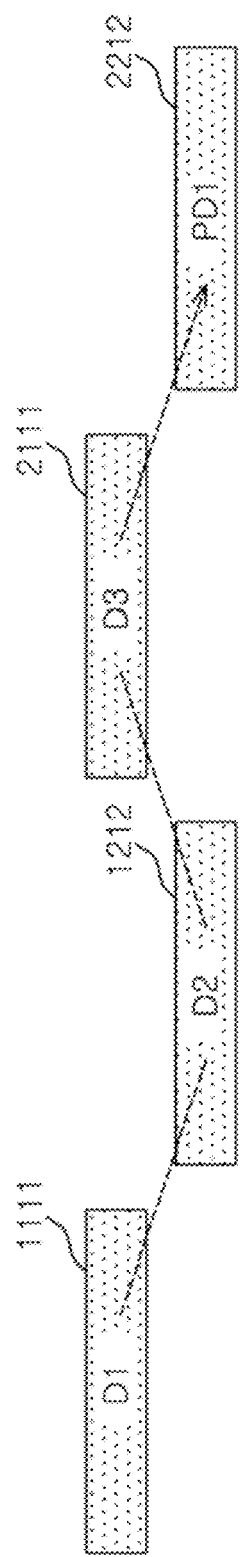
FIG. 4 is a diagram for describing a method for storing parity data of the page unit shown in FIG. 3.

FIG. 4 is a diagram for describing a method for storing parity data of the page unit shown in FIG. 3.

To Improve the data reliability of the page unit PU, the controller 110 may generate parity data PD for the data of the page unit PU stored in the random access memory 113. Such parity data PD may be generated by firmware or software driven by the control unit 111, or may be generated through separate hardware (not shown) for generating the parity data PD.

The controller 110 may generate the parity data PD by XORing or performing an XOR logic function on data to be stored (or stored) in the remaining pages of the page unit PU except a page where the parity data PD is to be stored. The controller 110 may store the parity data PD in any one of the pages forming the page unit PU.

For example, when making descriptions with reference to FIG. 4 that illustrates the first page unit PU1 of FIG. 3, the controller 110 may generate first parity data PD1 by XORing or performing an XOR logic function on first data D1 stored in the page 1111, second data D2 stored in the page 1212 and third data D3 stored in the page 2111. The controller 110 may store the first parity data PD1 in the page 2212.

In an example, the first data D1 is stored in the page 1111, the second data D2 is stored in the page 1212, the third data D3 is stored in the page 2111, and the first parity data PD1 is stored in the page 2212. However, it is to be readily understood that, if pages where the first data D1, the second data D2 and the third data D3 are to be stored are changed, the first parity data PD1 of the first page unit PU1 may be stored in the remaining page where the first to third data D1, D2 and D3 are not stored.

Although not shown, the controller 110 may store the parity data PD in another region which is irrespective of the page unit PU, for example, a memory block or a page designated to store the parity data PD.

The parity data PD may be used to recover the data of a page where a read fall has occurred, when the read fail has occurred in at least one of the pages Ps forming the page unit PU. Since a read fail recovery method using the parity data PD is generally known in the art, detailed descriptions thereof will be omitted herein.

Figure 5:
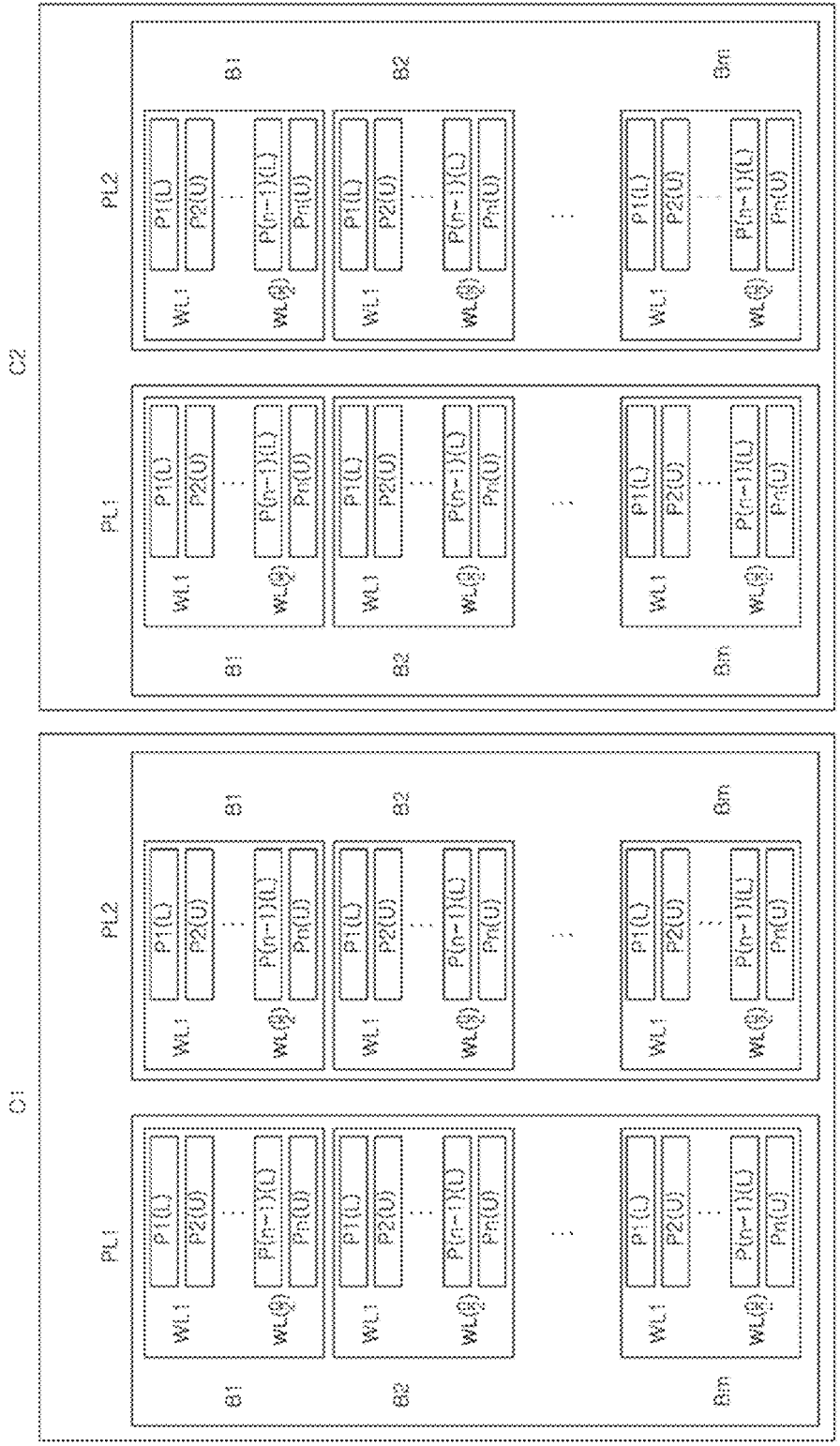
FIG. 5 is a detailed diagram illustrating a storage medium shown in FIG. 1, which includes bi-level cell type flash memory devices.
Figure 6:
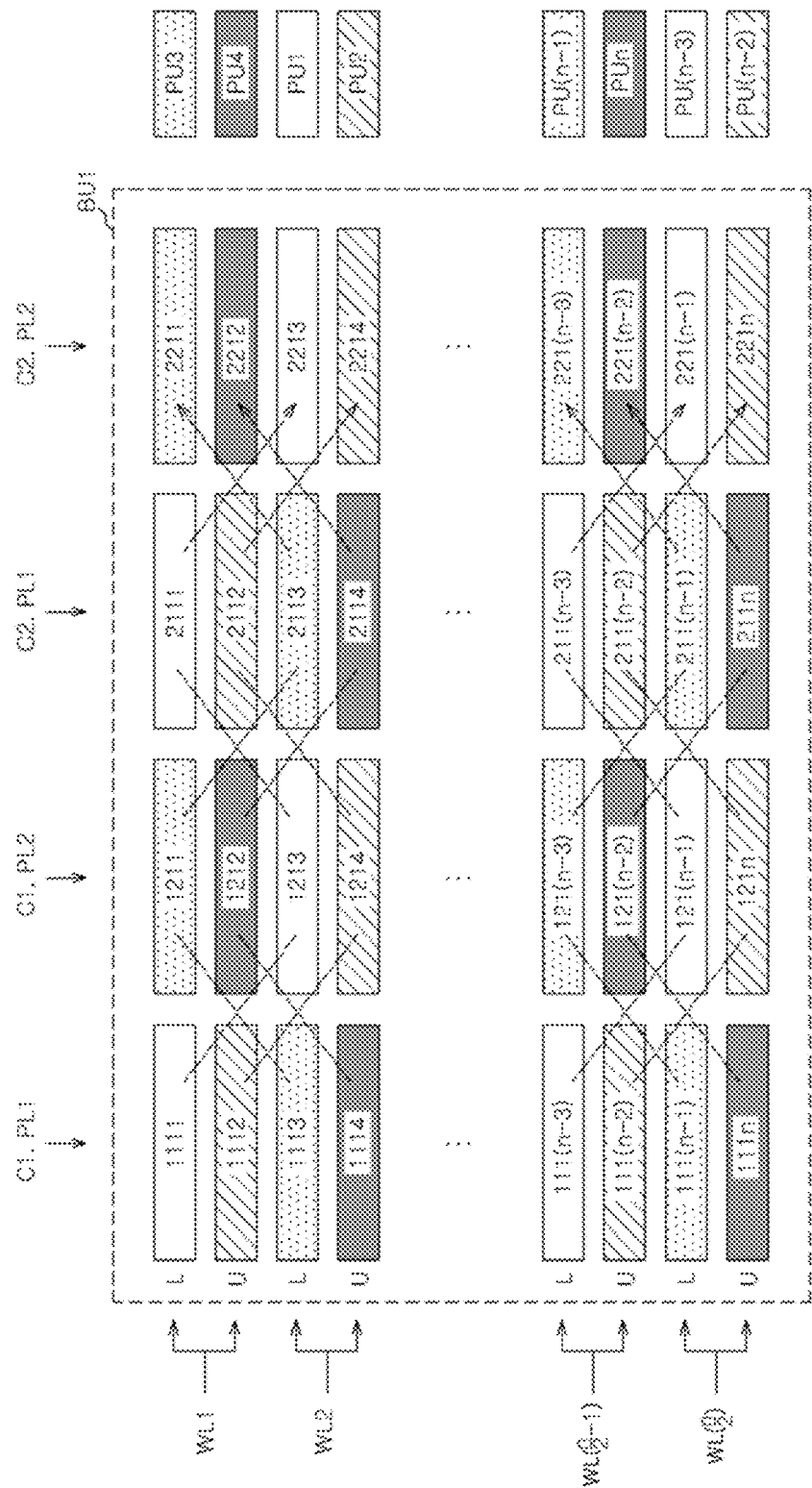
FIG. 6 is a diagram for describing a method for setting access units for the memory region structure shown in FIG. 5.

FIG. 5 is a detailed diagram illustrating the storage medium 120 shown in FIG. 1, which includes bi-level cell type flash memory devices. FIG. 6 is a diagram for describing a method for storing access units for the memory region structure shown in FIG. 5.

In an example, two flash memory devices C1 and C2 each including two planes PL1 and PL2, each of which includes m number of blocks B1 to Bm each including n number of pages P1 to Pn, forms the storage medium 120 of the data storage device 100. Since the structures of the first flash memory device C1 and the second flash memory device C2 are the same, descriptions for the second flash memory device C2 will be omitted.

Memory cells which configure the memory region of the first flash memory device C1 may include hierarchical cell sets or cell units in an operational viewpoint or in a physical (or structural) viewpoint. For example, memory cells which are electrically coupled with the same word line WL and are simultaneously read and programmed may be configured as a page P. In the bi-level cell type flash memory device C1, one word line WL may form two logic pages, that is, a lower page L in which first bit data is stored and an upper page U in which second bit data is stored. Memory cells which are simultaneously erased may be configured as a block B.

Sets of memory cells (that is, pages Ps), which are controlled by different read/program circuits (not shown), although they are electrically coupled with the same word line WL, may be included in different planes PLs according to the read/program circuits corresponding to them. Pages Ps which are included in different planes PLs among the logic pages Ps electrically coupled with physically the same word line WL will be defined as corresponding pages.

Because corresponding pages are electrically coupled with the same word line WL and are controlled by different read/program circuits, they may operate in parallel or individually. For example, the first page P1 of the first block 61 of the first plane PL1 and the first page P1 of the first block B1 of the second plane PL2 corresponding thereto may operate in parallel or individually.

In such a memory region structure, the controller 110 may set access units to efficiently control or access the respective blocks Bs and pages Ps of the flash memory devices C1 and C2.

The controller 110 may set an access unit (hereinafter, referred to as a block unit BU) by blocks of the respective planes PL1 and PL2 of the flash memory devices C1 and C2 which have the same block address. For example, the controller 110 may set a first block unit BU1 using the first block B1 of the first plane PL1 of the first flash memory device C1, the first block B1 of the second plane PL2 of the first flash memory device C1, the first block B1 of the first plane PL1 of the second flash memory device C2 and the first block B1 of the second plane PL2 of the second flash memory device C2.

The controller 110 may set a page access unit PU using pages Ps electrically coupled with different word lines WLs of the respective planes PL1 and PL2 of the flash memory devices C1 and C2. In detail, the controller 110 may set the page unit PU by alternating the same type of logic pages Ps electrically coupled with physically adjacent word lines WLs, for example, consecutive word lines WLs, in the order of the planes PL1 and PL2 and the flash memory devices C1 and C2.

For example, a first page unit PU1 may be set to include a lower page 1111, a lower page 1213, a lower page 2111 and a lower page 2213. The lower page 1111 is electrically coupled with a first word line WL1 and included in the first plane PL1. The lower page 1213 is electrically coupled with a second word line WL2 consecutive to the first word line WL1 in ascending order of word line address and included in the second plane PL2 next to the first plane PL1 where the lower page 1111 is included. The lower page 2111 is electrically coupled with the first word line WL1 consecutive to the second word line WL2 in descending order and included in the second flash memory device C2 next to the first flash memory device C1 where the lower page 1213 is included and in the first plane PL1 next to the second plane PL2 where the lower page 1213 is included. The lower page 2213 is electrically coupled with the second word line WL2 consecutive to the first word line WL1 in ascending order of word line address and included in the second plane PL2 next to the first plane PL1 where the lower page 2111 is included.

In this way, the controller 110 may set page units PU1 to PUn among lower pages and among upper pages in the first block unit BU1.

Figure 7:
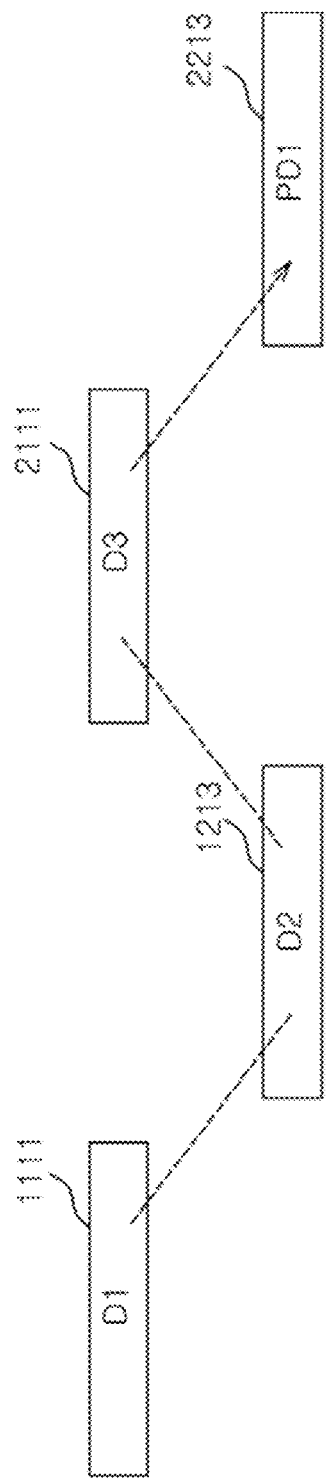
FIG. 7 is a diagram for describing a method for storing parity data of the page unit shown in FIG. 6.

FIG. 7 is a diagram for describing a method for storing parity data of the page unit shown in FIG. 6.

To improve the data reliability of the page unit PU, the controller 110 may generate parity data PD for the data of the page unit PU stored in the random access memory 113. That is to say, the controller 110 may generate the parity data PD by XORing or performing an XOR logic function on data to be stored (or stored) in the remaining pages of the page unit PU except a page where the parity data PD is to be stored. The controller 110 may store the parity data PD in any one of the pages forming the page unit PU.

For example, when making reference to FIG. 7, which illustrates the first page unit PU1 of FIG. 6, the controller 110 may generate first parity data PD1 by XORing or performing an XOR logic function on first data D1 stored in the lower page 1111, second data D2 stored in the lower page 1213 and third data D3 stored in the lower page 2111. The controller 110 may store the first parity data PD1 in the lower page 2213.

In an example, the first data D1 is stored in the lower page 1111, the second data D2 is stored in the lower page 1213, the third data D3 is stored in the lower page 2111, and the first parity data PD1 is stored in the lower page 2213. However, it is to be readily understood that, if lower pages where the first data D1, the second data D2 and the third data D3 are to be stored are changed, the first parity data PD1 of the first page unit PU1 may be stored in the remaining lower page where the first to third data D1, D2 and D3 are not stored.

Figure 8:
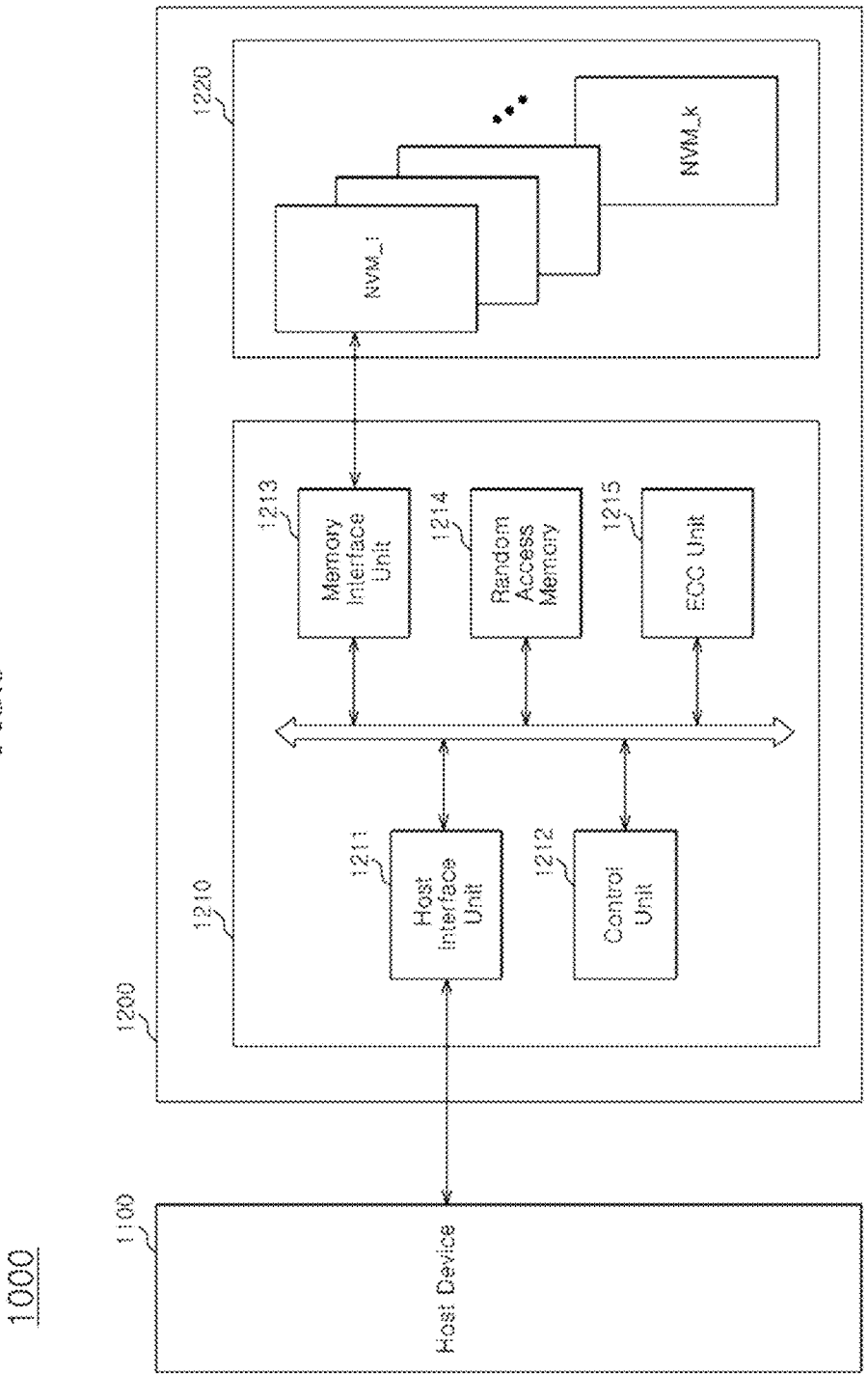
FIG. 8 is a block diagram illustrating a data processing system including a data storage device in accordance an embodiment of the present invention.

FIG. 8 is a block diagram illustrating a data processing system 1000 including a data storage device in accordance an embodiment of the present invention. Referring to FIG. 8, the data processing system 1000 may include a host device 1100 and a data storage device 1200. The data storage device 1200 may include a controller 1210 and a nonvolatile memory device 1220.

As described above with reference to FIG. 3 or 6, the controller 1210 may set a block unit, and set a page unit using pages electrically coupled with different word lines in the block unit.

The controller 1210 may include a host interface unit 1211, a control unit 1212, a memory interface unit 1213, a random access memory 1214, and an error correction code (ECC) unit 1215.

The control unit 1212 may control the general operations of the controller 1210 in response to a request from the host device 1100. The control unit 1212 may drive firmware or software for controlling a nonvolatile memory device 1220.

The random access memory 1214 may be used as the working memory for the control unit 1212. The random access memory 1214 may be used as a data buffer memory which temporarily stores the data read from the nonvolatile memory device 1220 or the data provided from the host device 1100.

The host interface unit 1211 may interface the host device 1100 and the controller 1210. For example, the host interface unit 1211 may communicate with the host device 1100 through one of various interface protocols such as a universal serial bus (USB) protocol, a universal flash storage (UFS) protocol, a multimedia card (MMC) protocol, a peripheral component interconnection (PCI) protocol, a PCI express (PCI-E) protocol, a parallel advanced technology attachment (PATA) protocol, a serial advanced technology attachment (SATA) protocol, a small computer system Interface (SCSI) protocol, and a serial attached SCSI (SAS) protocol.

The memory interface unit 1213 may interface the controller 1210 and the nonvolatile memory device 1220. The memory interface unit 1213 may provide commands and addresses to the nonvolatile memory device 1220. Furthermore, the memory interface unit 1213 may exchange data with the nonvolatile memory device 1220.

The error correction code unit 1215 may detect an error of the data read from the nonvolatile memory device 1220. Also, the error correction code unit 1215 may correct the detected error when the detected error is within a correctable range.

The nonvolatile memory device 1220 may be used as the storage medium of the data storage device 1200. The nonvolatile memory device 1220 may include a plurality of nonvolatile memory chips (or dies) NVM_1 to NVM_k.

The controller 1210 and the nonvolatile memory device 1220 may be manufactured as any one of various data storage devices. For example, the controller 1210 and the nonvolatile memory device 1220 may be integrated into one semiconductor device and may be manufactured as any one of a multimedia card in the form of an MMC, an eMMC, an RS-MMC and a micro-MMC, a secure digital card in the form of an SD, a mini-SD and an micro-SD, a universal serial bus (USB) storage device, a universal flash storage (UFS) device, a personal computer memory card international association (PCMCIA) card, a compact flash (CF) card, a smart media card, a memory stick, and so forth.

Figure 9:
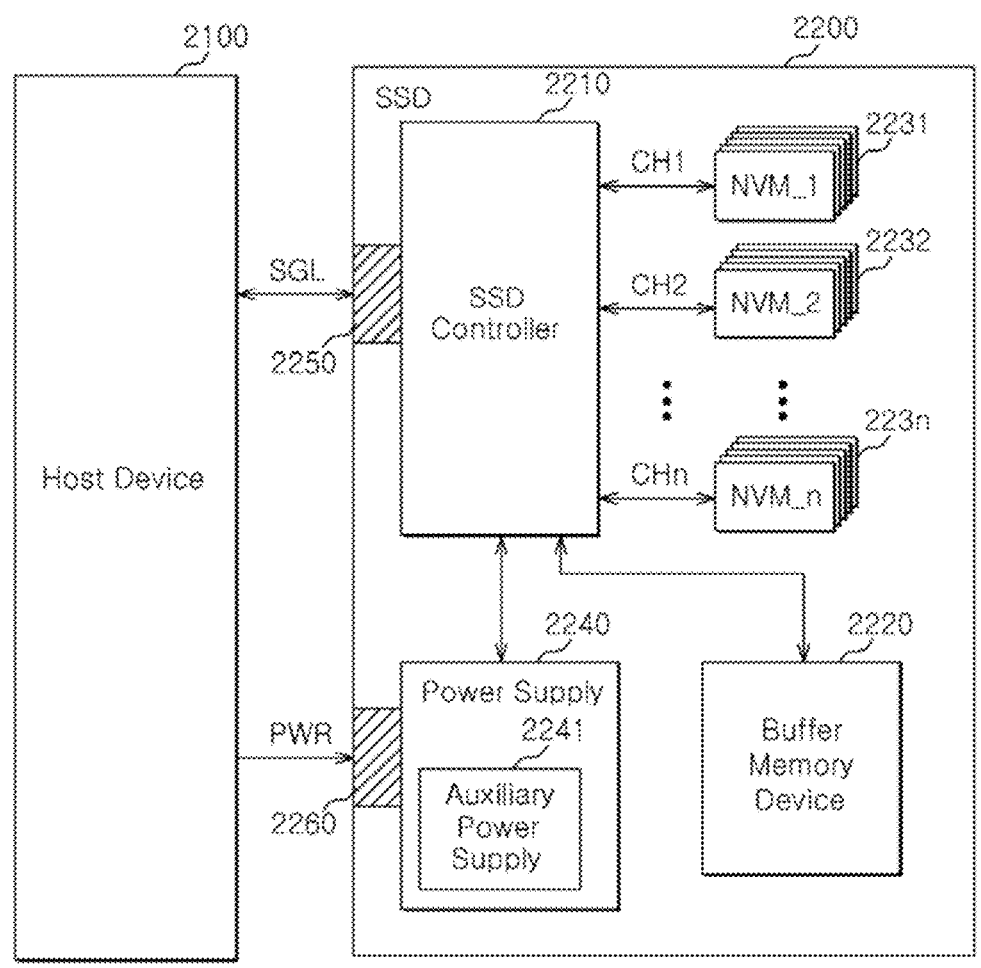
FIG. 9 is a block diagram illustrating a data processing system including a solid-state drive (SSD) in accordance with an embodiment of the present invention.

FIG. 9 is a block diagram illustrating a data processing system 2000 including an SSD in accordance with an embodiment of the present invention. Referring to FIG. 9, the data processing system 2000 may include a host device 2100 and a solid state drive (SSD) 2200.

The SSD 2200 may include an SSD controller 2210, the buffer memory device 2220, nonvolatile memory devices 2231 to 223n, a power supply 2240, a signal connector 2250, and a power connector 2260.

The SSD controller 2210 may access the nonvolatile memory devices 2231 to 223n in response to a request from the host device 2100. As described above with reference to FIG. 3 or 6, the SSD controller 2210 may set a block unit, and set a page unit using pages electrically coupled with different word lines in the block unit.

The buffer memory device 2220 may temporarily store data which are to be stored in the nonvolatile memory devices 2231 to 223n. Further, the buffer memory device 2220 may temporarily store data which are read from the nonvolatile memory devices 2231 to 223n. The data temporarily stored in the buffer memory device 2220 may be transmitted to the host device 2100 or the nonvolatile memory devices 2231 to 223n under the control of the SSD controller 2210.

The nonvolatile memory devices 2231 to 223n may be used as storage media of the SSD 2200. The nonvolatile memory devices 2231 to 223n may be electrically coupled to the SSD controller 2210 through a plurality of channels CH1 to CHn, respectively. One or more nonvolatile memory devices may be electrically coupled to one channel. The nonvolatile memory devices electrically coupled to one channel may be electrically coupled to the same signal bus and data bus.

The power supply 2240 may provide power PWR inputted through the power connector 2260, to the inside of the SSD 2200. The power supply 2240 may include an auxiliary power supply 2241. The auxiliary power supply 2241 may supply power to allow the SSD 2200 to be normally terminated when a sudden power-off occurs. The auxiliary power supply 2241 may include large capacity capacitors capable of being charged with power PWR.

The SSD controller 2210 may exchange a signal SGL with the host device 2100 through the signal connector 2250. The signal SGL may include a command, an address, data, and so forth. The signal connector 2250 may be configured by a connector such as parallel advanced technology attachment (PATA), serial advanced technology attachment (SATA), small computer system interface (SCSI), serial attached SCSI (SAS), peripheral component interconnection (PCI) and PCI express (PCI-E) protocols, according to the interface scheme between the host device 2100 and the SSD 2200.

Figure 10:
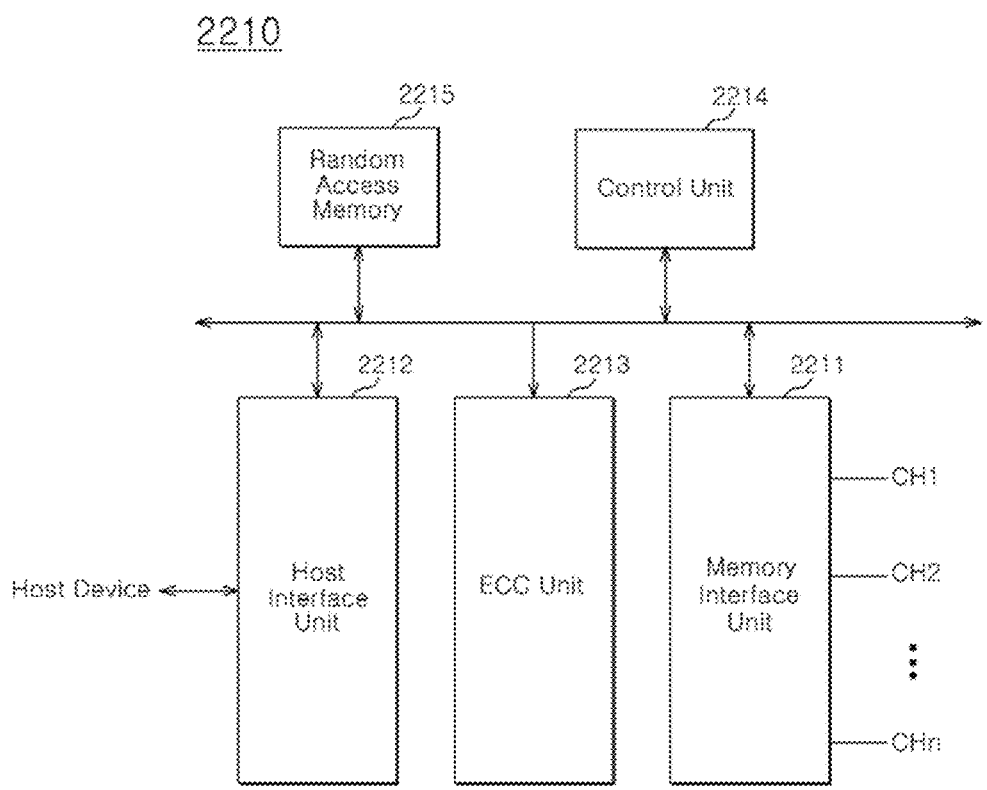
FIG. 10 is a detailed diagram of an SSD controller shown in FIG. 9.

FIG. 10 is a detailed diagram illustrating the SSD controller 2210 shown in FIG. 9. Referring to FIG. 10, the SSD controller 2210 may include a memory interface unit 2211, a host interface unit 2212, an error correction code (ECC) unit 2213, a control unit 2214, and a random access memory 2215.

The memory interface unit 2211 may provide a control signal such as a command and an address to the nonvolatile memory devices 2231 to 223n. Moreover, the memory interface unit 2211 may exchange data with the nonvolatile memory devices 2231 to 223n. The memory interface unit 2211 may scatter the data transmitted from the buffer memory device 2220 to the respective channels CH1 to CHn, under the control of the control unit 2214. Furthermore, the memory interface unit 2211 may transmit the data read from the nonvolatile memory devices 2231 to 223n to the buffer memory device 2220, under the control of the control unit 2214.

The host interface unit 2212 may provide an interface with the SSD 2200 corresponding to the protocol of the host device 2100. For example, the host interface unit 2212 may communicate with the host device 2100 through one of parallel advanced technology attachment (PATA), serial advanced technology attachment (SATA), small computer system interface (SCSI), serial attached SCSI (SAS), peripheral component interconnection (PCI) and PCI express (PCI-E) protocols. In addition, the host interface unit 2212 may perform a disk emulating function of supporting the host device 2100 to recognize the SSD 2200 as a hard disk drive (HDD).

The ECC unit 2213 may generate parity bits based on the data transmitted to the nonvolatile memory devices 2231 to 223n. The generated parity bits may be stored along with data in the nonvolatile memory devices 2231 to 223n. The ECC unit 2213 may detect an error of the data read from the nonvolatile memory devices 2231 to 223n. When the detected error is within a correctable range, the ECC unit 2213 may correct the detected error.

The control unit 2214 may analyze and process the signal SGL inputted from the host device 2100. The control unit 2214 may control the operations of the buffer memory device 2220 and the nonvolatile memory devices 2231 to 223n according to firmware or software for driving the SSD 2200. The random access memory 2215 may be used as a working memory for driving the firmware or the software.

Figure 11:
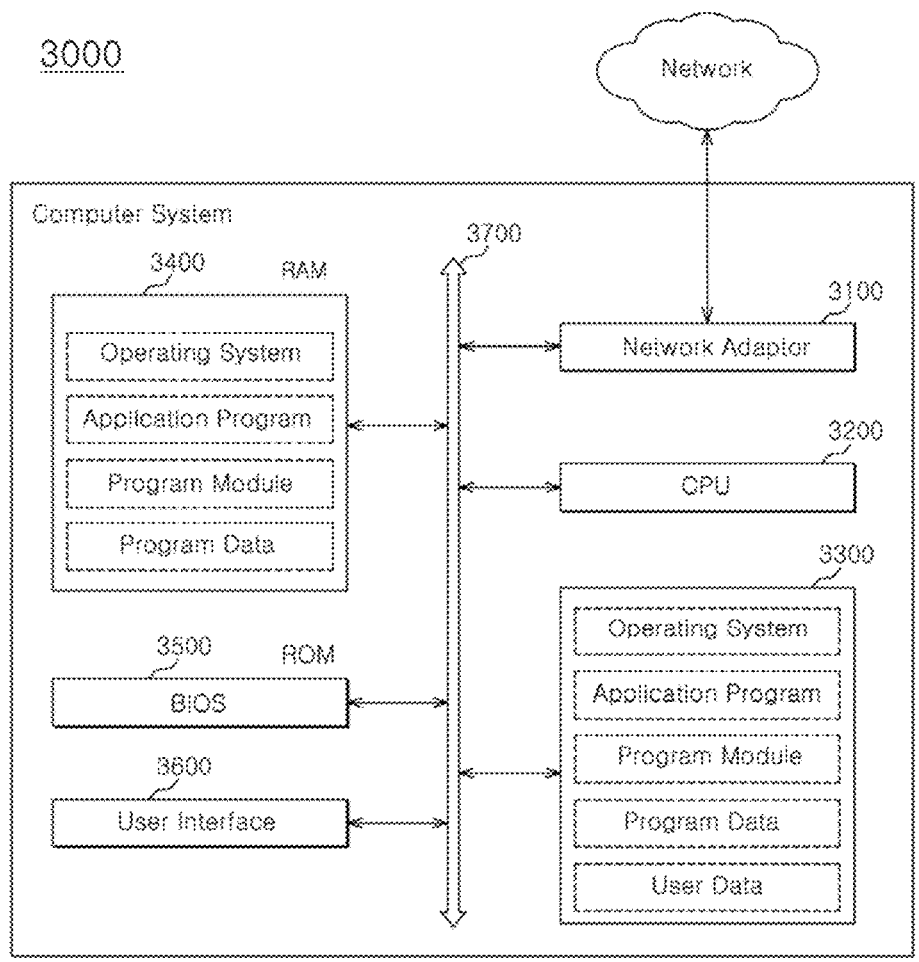
FIG. 11 is a block diagram illustrating a computer system including a data storage device in accordance with an embodiment of the present invention.

FIG. 11 is a block diagram illustrating a computer system 3000 including a data storage device in accordance with an embodiment of the present invention. Referring to FIG. 11, the computer system 3000 may include a network adaptor 3100, a central processing unit 3200, a data storage device 3300, a RAM 3400, a ROM 3500 and a user interface 3600, which are electrically coupled to a system bus 3700. The data storage device 3300 may be formed of the data storage device 100 shown in FIG. 1, the data storage device 1200 shown in FIG. 8 or the SSD 2200 shown in FIG. 9.

The network adaptor 3100 may provide interfacing between the computer system 3000 and external networks. The central processing unit 3200 performs general operations for driving an operating system residing at the RAM 3400 or an application program.

The data storage device 3300 may store general data necessary in the computer system 3000. For example, an operating system for driving the computer system 3000, an application program, various program modules, program data and user data may be stored in the data storage device 3300.

The RAM 3400 may be used as the working memory of the computer system 3000. Upon booting, the operating system, the application program, the various program modules and the program data necessary for driving programs, which are read from the data storage device 3300, may be loaded on the RAM 3400. A basic input/output system (BIOS) which is activated before the operating system is driven may be stored in the ROM 3500. Information exchange between the computer system 3000 and a user may be implemented through the user interface 3600.

As is apparent from the above descriptions, according to the embodiments of the present invention, data reliability of a data storage device may be improved.

While various embodiments have been described above, it will be understood to those skilled in the art that the embodiments are examples only. Accordingly, the embodiments should not limit the claims but, instead, aid in understanding the claims.

What is claimed is:

1. An operating method of a data storage device including a controller, the operating method comprising:
   providing a nonvolatile memory device, wherein the nonvolatile memory device includes a first plane and a second plane, a first word line and a second word line, and the first and second word lines are extended from the first plane to the second plane;
   setting, by the controller, a first page access unit using a first page electrically coupled with the first word line of the first plane and a second page electrically coupled with the second word line of the second plane; and
   setting, by the controller, a second page access unit using a third page electrically coupled with the second word line of the first plane and a fourth page electrically coupled with the first word line of the second plane,
   wherein the first page and the fourth page are connected to the first word line, and the second page and the third page are connected to the second word line.

2. The operating method according to claim 1, wherein the second word line is consecutive to the first word line in ascending order of a physical word line address.

3. The operating method according to claim 1, wherein the second word line is consecutive to the first word line in ascending order of a logical word line address.

4. The operating method according to claim 1, further comprising:
   generating, by the controller, first parity data for data to be stored in the first and second pages forming the first page access unit; and
   generating, by the controller, second parity data for data to be stored in the third and fourth pages forming the second page access unit.

5. The operating method according to claim 4, wherein the first and second parity data are generated through performing an XOR logic function.

6. The operating method according to claim 1, further comprising:
   setting, by the controller, a block access unit using memory blocks having the same block address among memory blocks of the first and second planes.

7. The operating method according to claim 6, wherein the first and second page access units are included in the block access unit.

8. An operating method of a data storage device including a controller, the operating method comprising:
   providing a nonvolatile memory device, wherein the nonvolatile memory device includes a first plane and a second plane, a first word line and a second word line, and the first and second word lines are extended from the first plane to the second plane;
   setting, by the controller, a first page access unit using a first logic page electrically coupled with the first word line of the first plane and a third logic page electrically coupled with the second word line of the second plane;
   setting, by the controller, a second page access unit using a second logic page electrically coupled with the first word line of the first plane and a fourth logic page electrically coupled with the second word line of the second plane;
   setting, by the controller, a third page access unit using a third logic page electrically coupled with the second word line of the first plane and a first logic page electrically coupled with the first word line of the second plane; and
   setting, by the controller, a fourth page access unit using a fourth logic page electrically coupled with the second word line of the first plane and a second logic page electrically coupled with the first word line of the second plane,
   wherein the first and second logic pages are connected to the first word line, and the third and fourth logic pages are connected to the second word line.

9. The operating method according to claim 8, wherein the second word line is consecutive to the first word line in ascending order of a physical word line address.

10. The operating method according to claim 8, wherein the second word line is consecutive to the first word line in ascending order of a logical word line address.

11. The operating method according to claim 8, further comprising:
    generating, by the controller, parity data for the respective page access units.

12. The operating method according to claim 8, further comprising:
    setting, by the controller, a block access unit using memory blocks having the same block address among memory blocks of the first and second planes.

13. The operating method according to claim 12, wherein the first to fourth page access units are included in the block access unit.

14. A data storage device comprising:
    first and second nonvolatile memory devices each including first and second planes and first and second word lines extending from the first plane to the second plane; and
    a controller setting an access unit for accessing the first and second nonvolatile memory devices,
    wherein each of the first and second planes of the respective first and second nonvolatile memory devices includes first pages electrically coupled with the first word line and second pages electrically coupled with the second word line, and
    wherein the access unit includes a first page access unit using the first page of the first plane of the first nonvolatile memory device, the second page of the second plane of the first nonvolatile memory device, the first page of the first plane of the second nonvolatile memory device, and the second page of the second plane of the second nonvolatile memory device, and a second page access unit using the second page of the first plane of the first nonvolatile memory device, the first page of the second plane of the first nonvolatile memory device, the second page of the first plane of the second nonvolatile memory device, and the first page of the second plane of the second nonvolatile memory device.

15. The data storage device according to claim 14, wherein the second word line is consecutive to the first word line in ascending order of physical word line addresses.

16. The data storage device according to claim 14, wherein the second word line is consecutive to the first word line in ascending order of logical word line addresses.

17. The data storage device according to claim 14,
- wherein the first pages of the respective first and second nonvolatile memory devices includes first upper logic pages and first lower logic pages electrically coupled with the first word line, and the second pages of the respective first and second nonvolatile memory devices includes second upper logic pages and second lower logic pages electrically coupled with the second word line,
- wherein the first page access unit includes a first upper page access unit and a first lower page access unit, and the second page access unit includes a second upper page access unit and a second lower page access unit
- wherein the first upper page access unit includes the first upper logic page of the first plane of the first nonvolatile memory device, the second upper logic page of the second plane of the first nonvolatile memory device, the first upper logic page of the first plane of the second nonvolatile memory device, and the second upper logic page of the second plane of the second nonvolatile memory device,
- wherein the first lower page access unit includes the first lower logic page of the first plane of the first nonvolatile memory device, the second lower logic page of the second plane of the first nonvolatile memory device, the first lower logic page of the first plane of the second nonvolatile memory device, and the second lower logic page of the second plane of the second nonvolatile memory device,
- wherein the second upper page access unit includes the second upper logic page of the first plane of the first nonvolatile memory device, the first upper logic page of the second plane of the first nonvolatile memory device, the second upper logic page of the first plane of the second nonvolatile memory device, and the first upper logic page of the second plane of the second nonvolatile memory device, and
- wherein the second lower page access unit includes the second lower logic page of the first plane of the first nonvolatile memory device, the first lower logic page of the second plane of the first nonvolatile memory device, the second lower logic page of the first plane of the second nonvolatile memory device, and the first lower logic page of the second plane of the second nonvolatile memory device.

18. The data storage device according to claim 14, wherein the controller sets a block access unit using memory blocks having the same block address among memory blocks of the first and second planes of the respective first and second nonvolatile memory devices.

19. The data storage device according to claim 18, wherein the controller sets the page access unit to be included in the block access unit.

* * * * *